(12) United States Patent
Brintzinger et al.

(10) Patent No.: US 7,115,496 B2
(45) Date of Patent: Oct. 3, 2006

(54) METHOD FOR PROTECTING THE REDISTRIBUTION LAYER ON WAFERS/CHIPS

(75) Inventors: Axel Brintzinger, Dresden (DE); Octavio Trovarelli, Dresden (DE)

(73) Assignee: Infineon Technologies AG, Munich (DE)

( * ) Notice: Subject to any disclaimer, the term of this patent is extended or adjusted under 35 U.S.C. 154(b) by 151 days.

(21) Appl. No.: 10/826,603

(22) Filed: Apr. 16, 2004

(65) Prior Publication Data

US 2004/0248343 A1    Dec. 9, 2004

(30) Foreign Application Priority Data

Apr. 17, 2003    (DE)    ................. 103 18 078

(51) Int. Cl.
*H01L 21/44* (2006.01)
*H01L 23/485* (2006.01)

(52) U.S. Cl. ................. 438/614; 438/612; 438/613; 438/E23.021

(58) Field of Classification Search ............ None
See application file for complete search history.

(56) References Cited

U.S. PATENT DOCUMENTS

| | | | |
|---|---|---|---|
| 5,284,888 A | | 2/1994 | Morgan |
| 5,683,943 A | * | 11/1997 | Yamada ................. 216/14 |
| 5,858,074 A | | 1/1999 | Cole et al. |
| 6,153,448 A | * | 11/2000 | Takahashi et al. ........ 438/114 |
| 6,441,500 B1 | | 8/2002 | Sumikawa et al. |
| 6,492,198 B1 | * | 12/2002 | Hwang ................. 438/108 |
| 6,645,606 B1 | * | 11/2003 | Nakano et al. ......... 428/209 |
| 2002/0177308 A1 | | 11/2002 | Chen et al. |
| 2005/0189649 A1 | * | 9/2005 | Maruyama et al. ....... 257/737 |

FOREIGN PATENT DOCUMENTS

| | | |
|---|---|---|
| EP | 0 437 979 B1 | 7/1991 |
| JP | 06-084917 A | 3/1994 |
| JP | 11-003 892 A | 1/1999 |

\* cited by examiner

*Primary Examiner*—Luan Thai
(74) *Attorney, Agent, or Firm*—Slater & Matsil, L.L.P.

(57) ABSTRACT

The invention relates to a method for protecting the redistribution layer on wafers/chips, which preferably comprises a structure constructed from a seed layer, a layer of copper situated on the seed layer, a nickel layer arranged thereon, and a gold layer covering the latter. The wafer (4) provided with the redistribution layer (1) is covered on its entire surface with an organic protective layer (12), e.g., made of BTA (benzotriazole), Glicoat or Preventol®, which protects the redistribution layer (1) from corrosion and oxidation in that it produces a dense covering of the metal surface of the redistribution layer (1) through chemical bonding.

26 Claims, 2 Drawing Sheets

METHOD FOR PROTECTING THE REDISTRIBUTION LAYER ON WAFERS/CHIPS

TECHNICAL FIELD

The invention relates to a method for protecting the redistribution layer on wafers/chips, which preferably comprises a seed layer, a layer of copper situated on the seed layer, a nickel layer arranged thereon, and a gold layer covering the latter.

BACKGROUND

The production of a redistribution layer, which realizes an electrical connection between active structures and an associated bonding pad on a wafer or a 3D structure in the form of a compliant element, is relatively complicated and requires a plurality of photolithographic process steps. Thus, the wafer first has to be coated with a photoresist, which subsequently has to be exposed and developed. This is followed by coating with a metal layer, after which the photoresist is stripped. These process steps have to be repeated until the desired layer sequence is achieved. These process steps are represented in principle in a scheme below.

Thus, in a method employed in practice at the present time, the necessary patterning of the gold layer is realized by means of a customary lithographic process. The redistribution layer is produced in this case in that, after the deposition of a seed layer and Cu/Ni layer situated thereon of the redistribution layer, the gold is deposited on the entire redistribution layer. The actual electrical conductor is in this case the Cu layer having the lowest electrical resistance.

This method can be represented in summary as follows:
a) Deposition of the seed layer
b) EPR1 (epoxy photoresist 1): Coating and patterning (lithography step 1)
c) Reroute plating, production of the Cu/Ni layer sequence on the seed layer
d) Coating of the reroute trace with Au
e) EPR2 (epoxy photoresist 2): Coating and patterning (lithography step 2)
f) (as required) selective etching of the Au layer (wet etching, CMP, or removal/stripping).

In this case, the Ni layer serves as an adhesion layer for the Cu layer and the latter in turn serves as an adhesion layer for the Au covering layer. Since the Au layer itself cannot oxidize, it serves, on the one hand, as a secure adhesion layer for a solder material, in order for example to connect a 3D structure to a connection pad of a printed circuit board, which is usually composed of Cu, and, on the other hand, as a protective layer for the Cu layer situated underneath. In other words, the Cu layer is largely protected from corrosion by the Au layer.

A particular disadvantage in the case where the redistribution layer is constructed with such a structure is the fact that the side edges of the redistribution layer are not protected at all against corrosion and oxidation. This means that the possibly laterally penetrating corrosion or advancing oxidation may ultimately lead locally to a destruction of the redistribution layer, thereby limiting the service life of the electronic component provided with such a redistribution layer.

During front-end IC production, the Cu metallization is protected from oxidation during CMP (chemical mechanical polishing) by BTA (benzotriazole), and afterward by a liner (TiN) and an oxide.

In the production of printed circuit boards (PCBs), the industry uses BTA or another organic layer in order to provide the printed circuit board with protection from oxidation prior to soldering. Furthermore, the conductive tracks on a printed circuit board are comparatively thick and wide, with the result that corrosion problems are not especially significant in this case.

The situation is different, however, in the case of redistribution layers on wafers or chips. In this case, the problem has hitherto been solved by encapsulating the redistribution layers through galvanic or electrical coating. However, this requires an additional lithography step, which increases the process complexity and costs.

Another possibility for protecting the Cu layer consists in using the soldering process in order to enclose the Cu layer by means of a UBM (under bump metallization). In this case, the redistribution layer is completely encapsulated, although this is not suitable for long conductive tracks and, moreover, would lead to a significant increase in costs.

SUMMARY OF THE INVENTION

In one aspect, the invention provides a method for protecting the redistribution layer on wafers without additional lithography steps and with cost-effectiveness. In the preferred embodiment, the wafer is provided with a redistribution layer that is covered on its entire surface with an organic protective layer. The protective layer protects the redistribution layer from corrosion and oxidation in that it produces a dense covering of the metal surface of the redistribution layer through chemical bonding.

By means of this method, which can be realized in a particularly simple manner, an effective protection of the redistribution layer and, in particular, the Cu layer thereof is achieved without any further photolithography step.

BTA (benzotriazole) Glicoat® (registered trademark of the company Shikoku Chemical Corp.) or Preventol® (registered trademark of the company Bayer Chemical) are preferably taken into consideration for the organic protective layer.

In continuation of the invention, the protective layer is applied by spraying or by dipping the wafer/chip into a liquid reservoir. In the former case, the wafer should be preheated to approximately 30° C., whereas in the second case the temperature of the liquid reservoir should be approximately 30° C.

In order to avoid any corrosion or oxidation beginnings, it is advantageous if the wafer is etched directly prior to coating with the organic protective layer.

A further refinement of the invention provides for the coating of the wafer to be renewed after the latter has been singulated and the singulated chips have been mounted on a carrier.

BRIEF DESCRIPTION OF THE DRAWINGS

The invention will be explained in more detail below using an exemplary embodiment. In the associated drawings.

DETAILED DESCRIPTION OF ILLUSTRATIVE EMBODIMENTS

Figure 1:
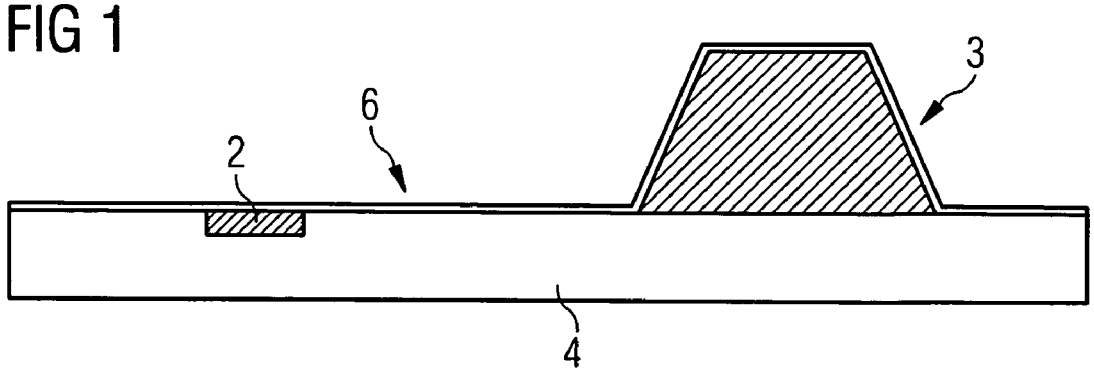
FIG. 1 shows a detail from a wafer with a compliant element after coating with a seed layer.
Figure 2:
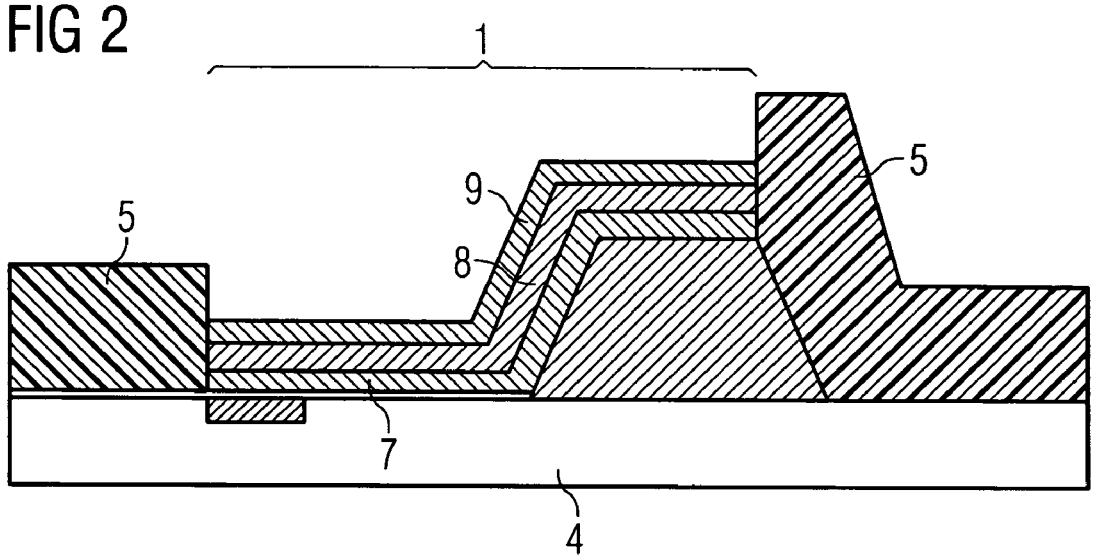
FIG. 2 shows the wafer according to FIG. 1 with an EPR (electrophoretic resist) after a first photolithography and a redistribution layer between a bonding pad and the compliant element.
Figure 3:
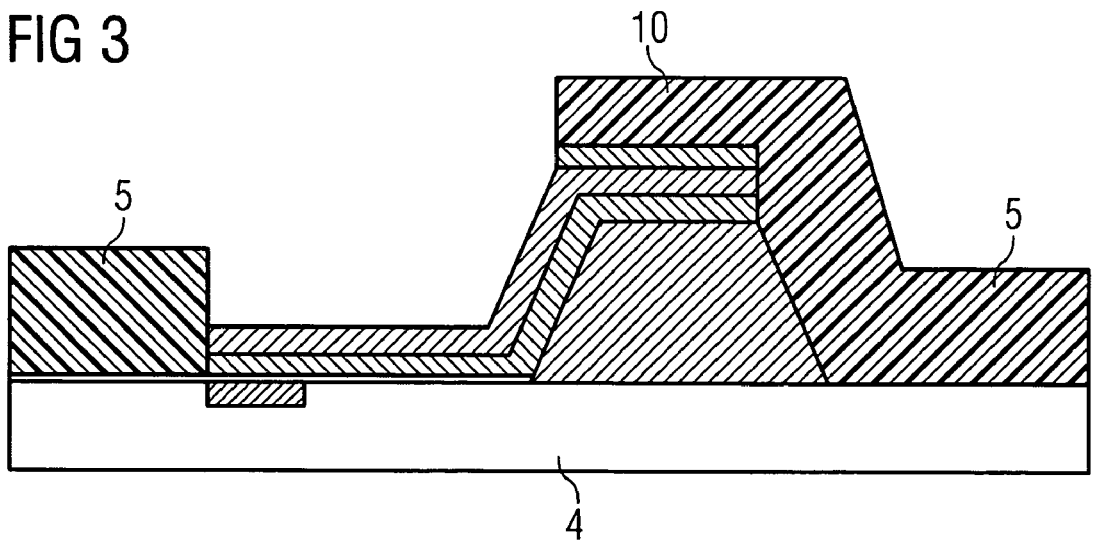
FIG. 3 shows the wafer according to FIG. 2 after the partial removal of the Au layer.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The production of a redistribution layer 1 from a bonding pad 2 to a 3D structure 3 on a wafer 4 is illustrated diagrammatically and only in essential steps in FIGS. 1 to 4. The 3D structure may be a compliant element serving to produce an electrical connection to a connection pad on a carrier element, e.g., a printed circuit board.

In order to realize the redistribution layer, first an EPR1 mask 5 is produced on the wafer 4 by means of a lithography step, said mask 5 serving as a mask for the subsequent reroute plating (production of the redistribution layer). For this purpose, first a seed layer 6 is applied (FIG. 1), which serves as an adhesion layer for the Cu layer 7 that is to be applied to said seed layer 6. For its part, the Cu layer 7 serves as an adhesion layer for the Ni layer 8 that is to be applied above it, said Ni layer 8 protecting the Cu layer 7 from corrosion. Finally, a Au layer 9 is applied on the Ni layer 8 (FIG. 2) and, for its part, serves as a secure adhesion layer for a solder material.

In order to prevent solder material from running down the 3D structure 3 during a later soldering operation, it is desired that the Au layer 9 be partially removed again from the redistribution layer 1, the Au layer 9 having to be preserved on the 3D structure 3 in order to be able to realize a soldering connection. For this purpose, as can be seen from FIG. 3, a further EPR2 mask 10 is produced for covering the upper region of the 3D structure 3 by means of a further photolithography step and the Au layer 9 is subsequently stripped.

Figure 4:
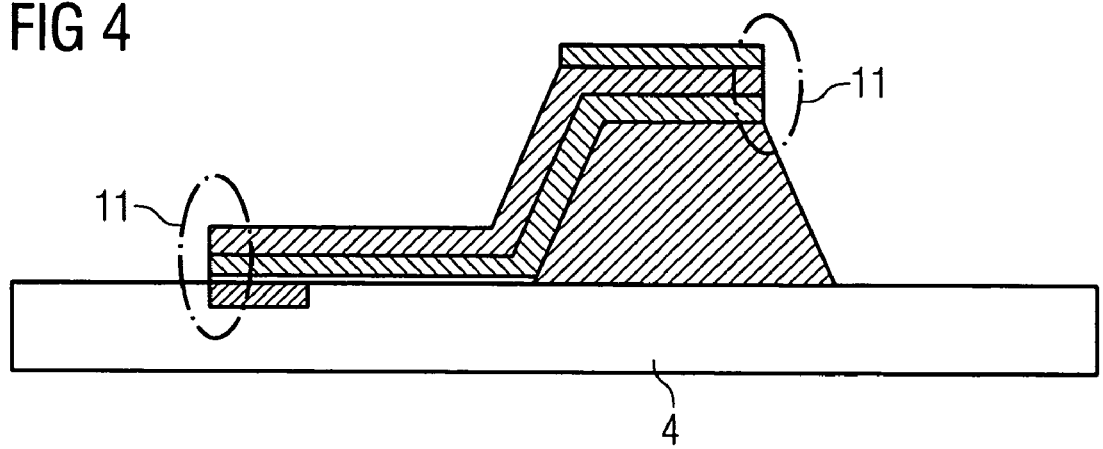
FIG. 4 shows the wafer according to FIG. 3 after the removal of the EPR and the stripping of the seed layer.

In order to complete the redistribution layer 1, the EPR1 mask 5 and EPR2 mask 10 and also the seed layer 6 are finally stripped (FIG. 4).

As a result, it can be ascertained without difficulty that the Cu layer 7 is protected from above by the Ni layer 8 situated thereon, but not at the end faces/side edges 11. There is thus the risk of corrosion or oxidation of the Cu layer 7, which ultimately leads to an impairment of the electrical properties.

Figure 5:
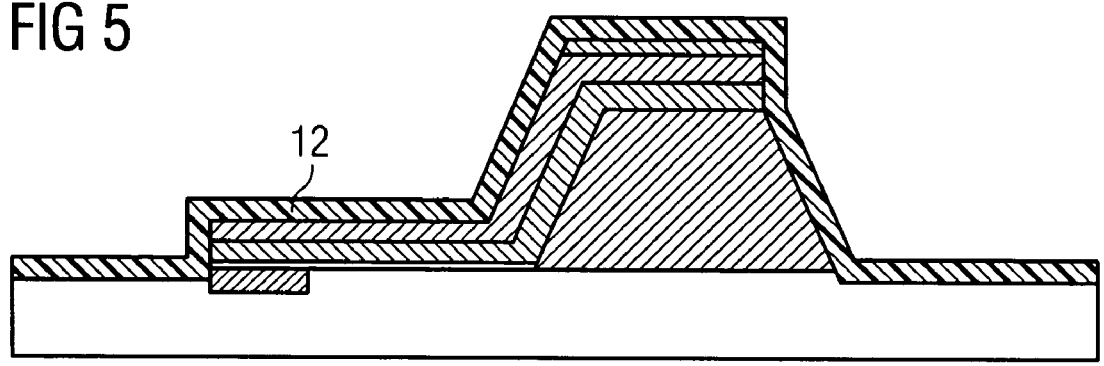
FIG. 5 shows the wafer coated over the whole area with an organic substance such as BTA, Glicoat® or Preventol®.

In order to prevent this, the wafer 4 provided with the redistribution layer 1 is covered on its entire surface with an organic protective layer 12 (FIG. 5), which protects the redistribution layer 1 from corrosion and oxidation in that it produces a dense covering of the metal surface of the redistribution layer through chemical bonding.

BTA (benzotriazole), Glicoat® (registered trademark of the company Skikoku Chemical Corp.) or Preventol® (registered trademark of the company Bayer Chemical) may preferably be used for the organic protective layer. These materials may be applied in a very simple manner by spraying or by dipping the wafer/chip 4 into a liquid reservoir. In this case, the wafer or the liquid reservoir should be preheated to approximately 30° C.

In order to avoid any corrosion or oxidation beginnings, the wafer 4 should be slightly incipiently etched directly prior to coating with the organic protective layer. In other words, it is desired that any oxide that may have formed on the Cu layer 7 be removed prior to applying the protective layer.

Figure 6:
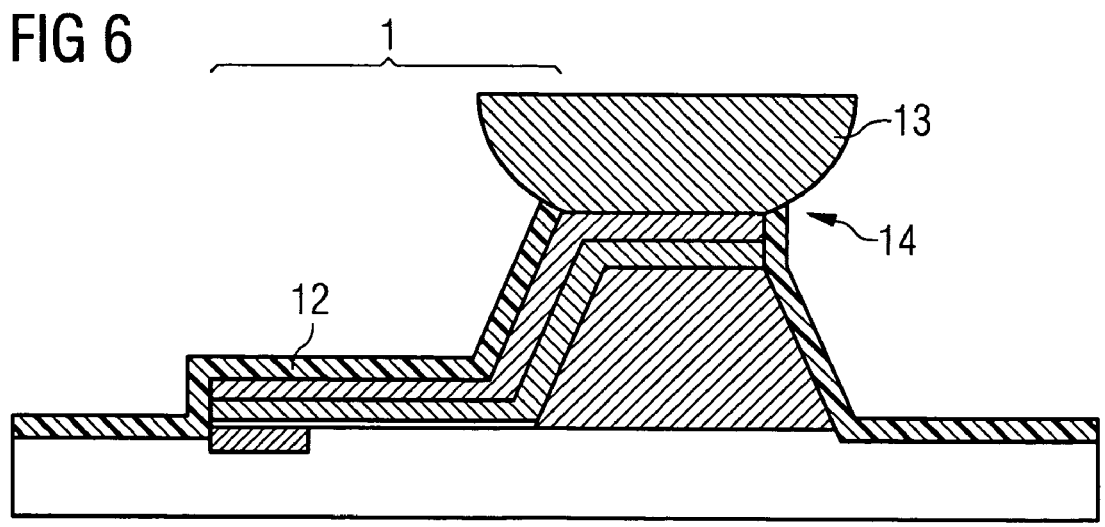
FIG. 6 shows the wafer after the soldering operation.

FIG. 6 shows a detail from the wafer 4 provided with an organic protective layer after a soldering operation. The organic protective layer 12 present on the 3D structure 3 vaporizes during the soldering operation, so that the solder material 13 adheres directly on the Au layer 9.

Depending on the duration of the soldering operation and the heating of the redistribution layer 1, the organic protective layer 12 may also vaporize in the vicinity of the soldering connection 14, with the result that the end faces/side edges 11 of the redistribution layer 1 are unprotected in this region.

In order to ensure a reliable protection here, it is possible to repeat the coating of the wafer 4 or of the chip with the organic material 12.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for protecting a redistribution layer on a wafer, wherein the wafer provided with the redistribution layer is covered on its entire surface with an organic protective layer, which protects the redistribution layer from corrosion and oxidation in that it produces a dense covering of the metal surface of the redistribution layer through chemical bonding, wherein the wafer is etched prior to the coating with the organic protective layer.

2. The method as claimed in claim 1 wherein the redistribution layer comprises a seed layer, a layer of copper situated on said seed layer, a nickel layer arranged thereon, and a gold layer covering the latter.

3. The method as claimed in claim 1, wherein BTA (benzotriazole) is used as the organic protective layer.

4. The method as claimed in claim 1, wherein Glicoat® is used as the organic protective layer.

5. The method as claimed in claim 1, wherein Preventol® is used as the organic protective layer.

6. The method as claimed in claim 1, wherein the organic protective layer is applied by spraying.

7. The method as claimed in claim 1, wherein the organic protective layer is applied by dipping the wafer into a liquid reservoir.

8. The method as claimed in claim 7, wherein the temperature of the liquid reservoir is at about 30° C.

9. The method as claimed in claim 1, wherein the coating of the wafer is repeated after the wafer has been mounted on a carrier.

10. A method for manufacturing a semiconductor device, the method comprising:
   providing a semiconductor device that includes a conductive area at an upper surface;
   forming a redistribution layer on the semiconductor device, the redistribution layer electrically coupling the conductive area to a connection region;
   coating the redistribution layer with an organic protective layer, wherein the semiconductor device is etched prior to the coating with the organic protective layer.

11. The method of claim 10 wherein the organic protective layer protects the redistribution layer from corrosion and oxidation in that it produces a dense covering of the metal surface of the redistribution layer through chemical bonding.

12. The method of claim 10 wherein the organic protective layer coats sidewalls of the redistribution layer.

13. The method of claim 10 wherein forming a redistribution layer comprises:
   forming a seed layer over the upper surface of the semiconductor device;
   patterning the seed layer in a redistribution layer pattern; and
   forming a copper layer over the seed layer.

14. The method of claim 13 and further comprising forming a nickel layer over the copper layer and forming a gold layer over the nickel layer.

15. The method of claim 10 wherein coating the redistribution layer comprises applying the organic protective layer by spraying.

16. The method of claim 10 wherein coating the redistribution layer comprises dipping the wafer into a liquid reservoir.

17. The method of claim 10 wherein the semiconductor device is etched immediately prior to the coating with the organic protective layer.

18. A method for manufacturing a semiconductor device, the method comprising:
   providing a semiconductor device that includes a conductive area at an upper surface;
   forming a redistribution layer on the semiconductor device, the redistribution layer electrically coupling the conductive area to a connection region;
   coating the redistribution layer with an organic protective layer;
   mounting the semiconductor device on a carrier; and
   repeating the coating of the semiconductor device after the semiconductor device has been mounted on the carrier.

19. A method for manufacturing a semiconductor device, the method comprising:
   providing a semiconductor device that includes a conductive area at an upper surface;
   forming a redistribution layer on the semiconductor device, the redistribution layer electrically coupling the conductive area to a connection region;
   coating the redistribution layer and the connection region with an organic protective layer; and
   performing a soldering operation at the connection area, wherein the soldering operation removes the organic protective layer from the connection area so that solder material adheres on the connection region.

20. The method of claim 19, further comprising performing a second coating operation after performing the soldering operation.

21. The method of claim 19, wherein the soldering operation causes portions of the organic protective layer to vaporize thereby removing the organic protective layer from the connection area.

22. The method of claim 19, wherein the redistribution layer comprises a seed layer, a layer of copper situated on said seed layer, a nickel layer arranged thereon, and a gold layer covering the latter.

23. The method of claim 19, wherein coating the redistribution layer comprises coating the redistribution with BTA (benzotriazole).

24. The method of claim 19, wherein the organic protective layer is applied by spraying.

25. The method of claim 19, wherein the organic protective layer is applied by dipping the wafer into a liquid reservoir.

26. The method of claim 19, wherein the redistribution layer is etched immediately prior to coating the redistribution layer.

* * * * *